US009659947B1

(12) United States Patent
Venkataramani et al.

(10) Patent No.: US 9,659,947 B1
(45) Date of Patent: May 23, 2017

(54) LOW COST HIGH PERFORMANCE EEPROM DEVICE

(71) Applicant: GLOBALFOUNDRIES Singapore Pte. Ltd., Singapore (SG)

(72) Inventors: Chandrasekar Venkataramani, Singapore (SG); Qiuji Zhao, Singapore (SG); Koe Sun Pak, Singapore (SG); Bai Yen Nguyen, Singapore (SG); Yoke Weng Tam, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 14/985,450

(22) Filed: Dec. 31, 2015

(51) Int. Cl.
*H01L 21/336* (2006.01)
*H01L 27/11524* (2017.01)
*H01L 29/423* (2006.01)

(52) U.S. Cl.
CPC .. *H01L 27/11524* (2013.01); *H01L 29/42328* (2013.01)

(58) Field of Classification Search
None
See application file for complete search history.

(56) References Cited

U.S. PATENT DOCUMENTS 7,232,722 B2    6/2007  Van Houdt et al.
9,276,206 B2 *  3/2016  Tan ..................... H01L 45/1226

* cited by examiner

*Primary Examiner* — Telly Green
(74) *Attorney, Agent, or Firm* — Horizon IP Pte. Ltd.

(57) ABSTRACT

Devices and methods for forming a device are presented. The method includes providing a substrate prepared with a cell area separated by other active areas by isolation regions. First and second lower sub-gates of first and second transistors are formed in the cell area. A common upper sub-gate of the first and second transistors is formed. The common upper sub-gate and first and second lower sub-gates are separated by an intergate dielectric layer and the common upper sub-gate surrounds the first and second lower sub-gates.

20 Claims, 15 Drawing Sheets

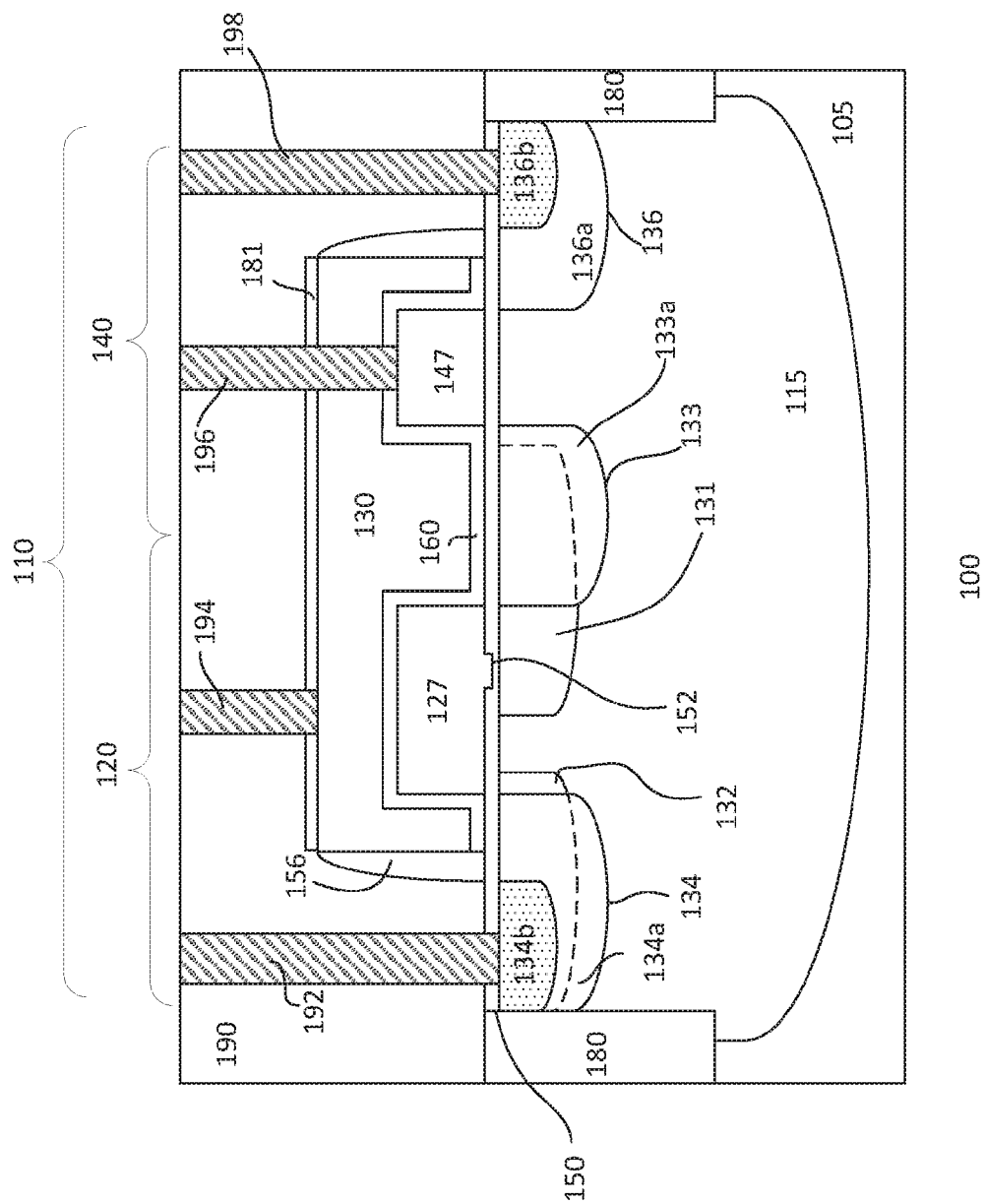

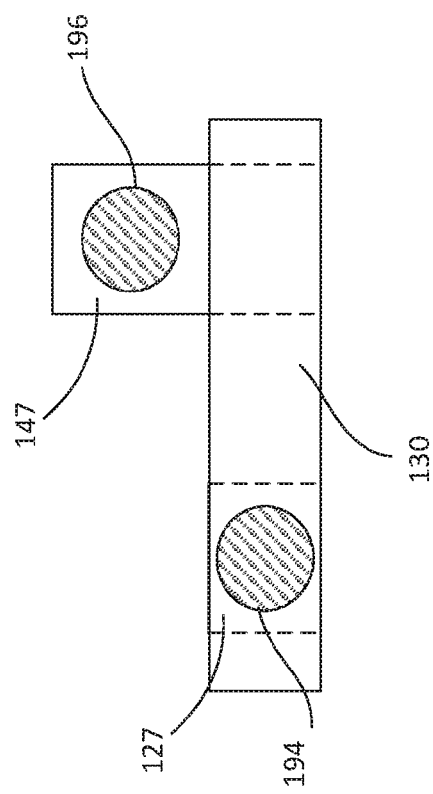
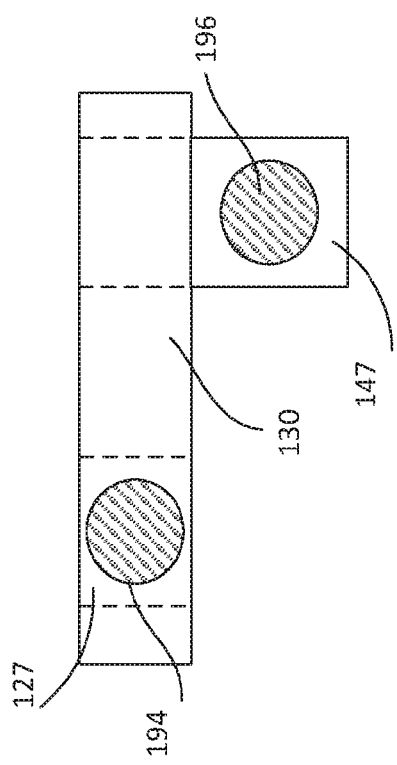

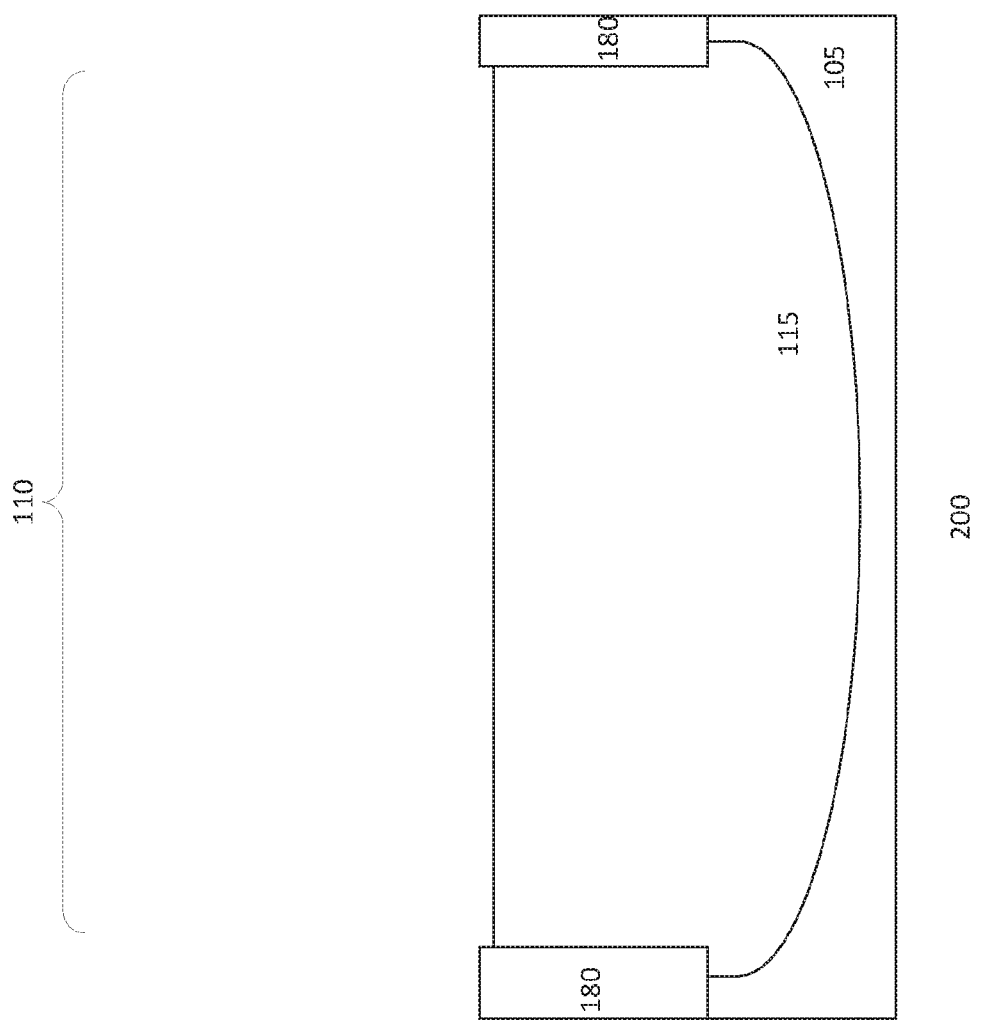

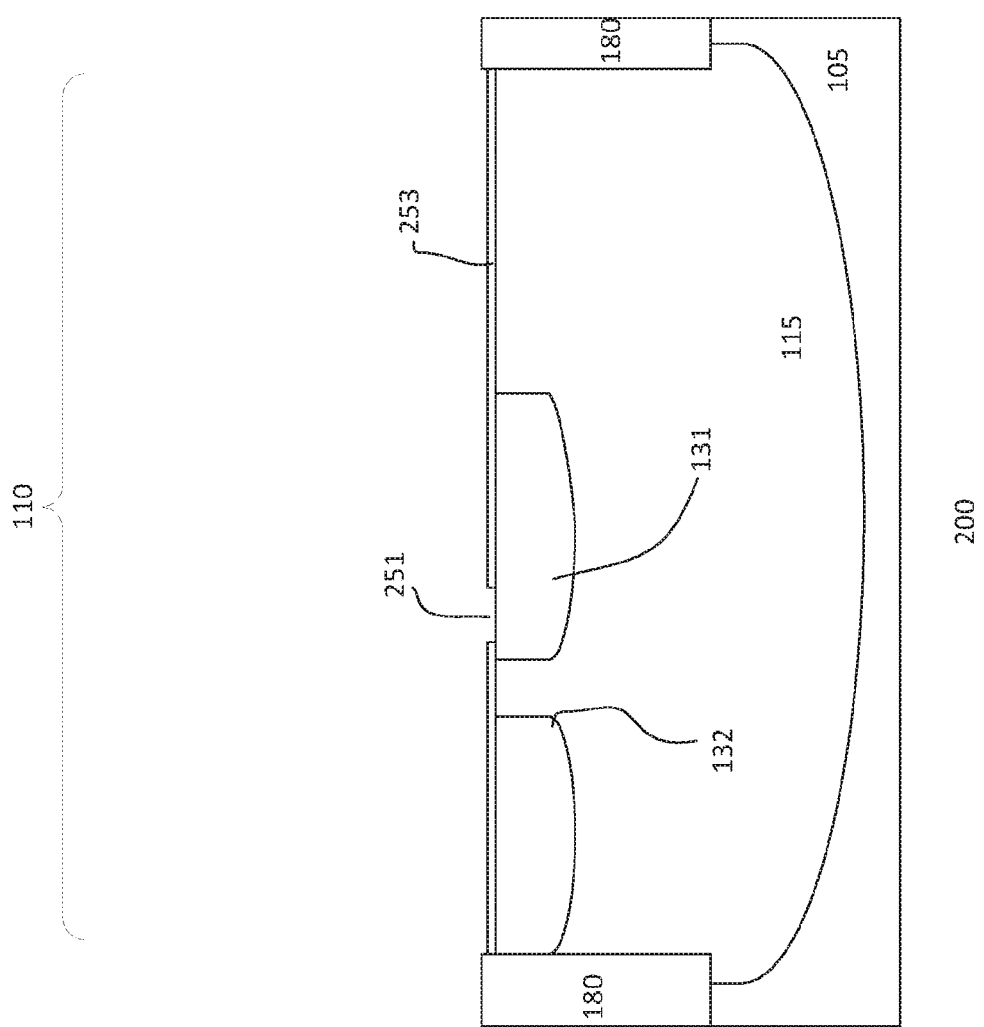

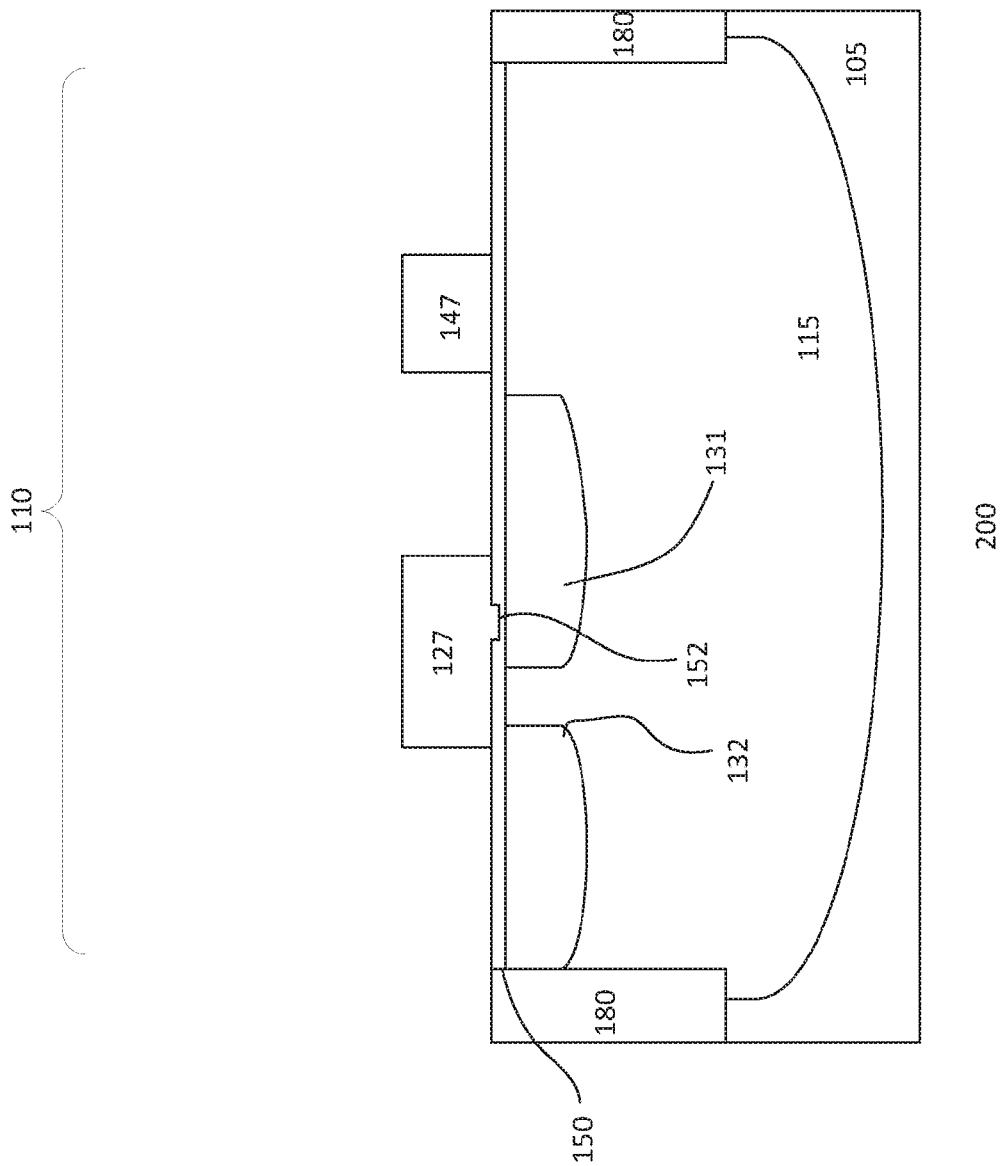

LOW COST HIGH PERFORMANCE EEPROM DEVICE

BACKGROUND

Non-volatile memory (NVM) circuits, such as electrically erasable programmable read-only memory (EEPROM) circuits have achieved widespread adoptions for code and data storage applications. An important aspect of NVM circuits is their cell size.

However, due to the demand for higher densities, there arises a need for NVM circuits with a reduced cell size as well as a reduction in programming voltage. Such NVM circuits should be able to be formed without increasing conventional processing steps thereby reducing the overall cost for the user.

It is, therefore, desirable to provide NVM memory cells formed from conventional processing steps with a reduced size thereby improving programming voltage and reducing the voltage stress.

SUMMARY

Embodiments generally relate to semiconductor devices and methods for forming a device.

In one embodiment, a method for forming a device is disclosed. The method includes providing a substrate prepared with a cell area separated by other active areas by isolation regions. First and second lower sub-gates of first and second transistors are formed in the cell area. A common upper sub-gate of the first and second transistors is formed. The common upper sub-gate and first and second lower sub-gates are separated by an intergate dielectric layer and the common upper sub-gate surrounds the first and second lower sub-gates.

In another embodiment, a device is disclosed. The device includes a substrate prepared with a cell area separated by other active areas by isolation regions. The device includes first and second transistors disposed in the cell area. The first and second transistors include first and second lower sub-gates disposed over the substrate, and a common upper sub-gate disposed over the first and second lower sub-gates. The common upper sub-gate is separated from the first and second lower sub-gates by an intergate dielectric layer and the common upper sub-gate surrounds the first and second lower sub-gates.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 1b-1c show cross-sectional views of embodiments of a memory cell;

FIG. 1di shows a simplified top view of a portion of the memory cell of FIG. 1b and FIG. 1d2 shows a simplified top view of a portion of the memory cell of FIG. 1c; and FIGS. 2a-2k show cross-sectional views of a process of forming an embodiment of a memory cell.

DETAILED DESCRIPTION

Embodiments generally relate to semiconductor devices. More particularly, some embodiments relate to memory devices, such as non-volatile memory devices. Such memory devices, for example, can be incorporated into standalone memory devices, such as USB or other types of portable storage units, or ICs, such as microcontrollers or system on chips (SoCs). The devices or ICs can be incorporated into or used with, for example, consumer electronic products, such as computers, cell phones, and personal digital assistants (PDAs).

Figure 1A:
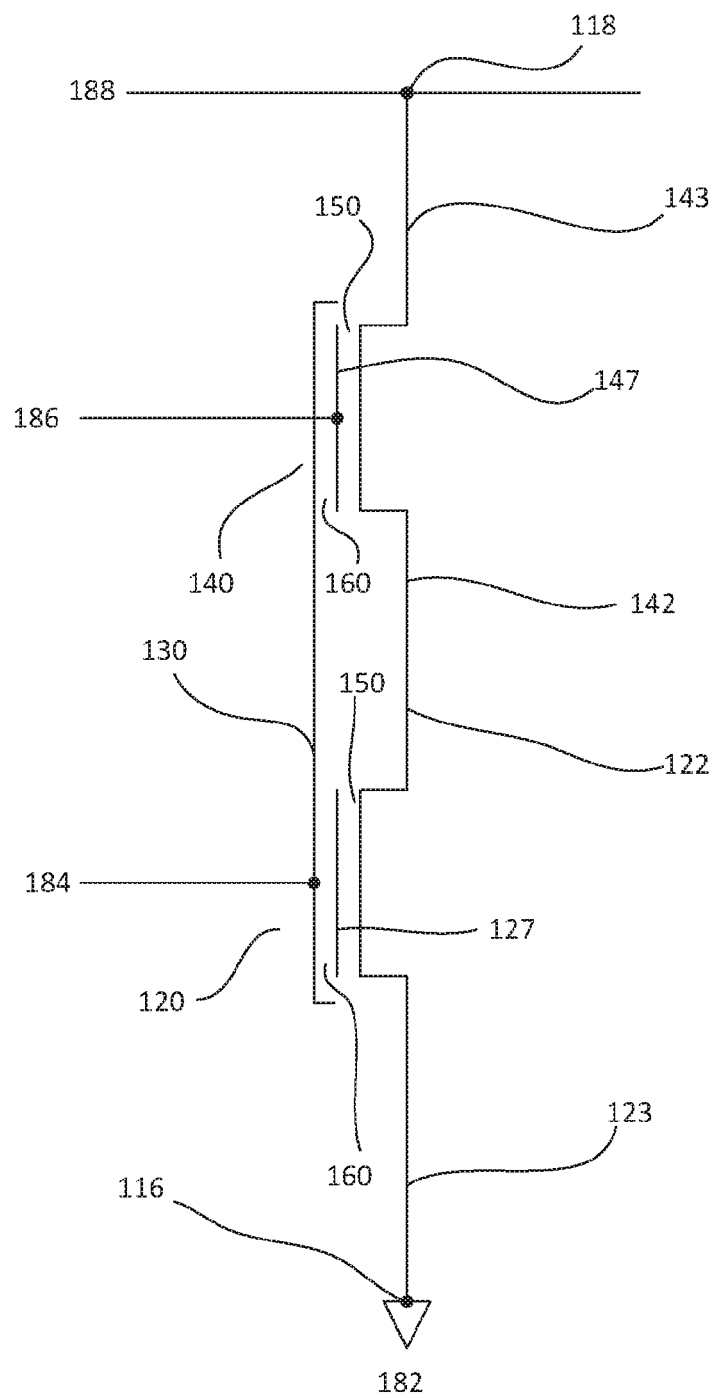
FIG. 1a shows a schematic diagram of an embodiment of a memory cell.

FIG. 1a shows a schematic diagram of an embodiment of a memory cell 100. The memory cell may include a non-volatile memory cell. For example, the memory cell may be an electrically erasable programmable read-only memory (EEPROM). In one embodiment, the memory cell includes a floating gate tunnel oxide (FLOTOX) EEPROM cell. Other types of memory cells may also be useful.

The memory cell, in one embodiment, includes a first transistor 120 and a second transistor 140. The first transistor includes a first lower sub-gate 127 between first and second transistor terminals 122 and 123. A gate dielectric layer 150 separates the first lower sub-gate 127 from the channel of the first transistor. As for the second transistor, it includes a second lower sub-gate 147 between first and second transistor terminals 142 and 143. A gate dielectric layer 150 separates the second lower sub-gate 147 from the channel of the second transistor. In one embodiment, the first and second transistors 120 and 140 share a common upper sub-gate 130, which is separated from the first and second lower sub-gates 127 and 147 by an intergate dielectric layer 160.

In one embodiment, the transistors are configured in series between first and second cell terminals 116 and 118. For example, the first terminals 122 and 142 of the first and second transistors, respectively, are commonly coupled while the second terminal 123 of the first transistor is coupled to the first cell terminal 116 and the second terminal 143 of the second transistor is coupled to the second cell terminal 118. The first cell terminal 116 is coupled to a first potential 182 and the second cell terminal 118 is coupled to a bitline 188. In one embodiment, the first potential is equal to ground. For example, the first potential may be the array ground.

In one embodiment, one of the first and second gate terminals is coupled to one of the lower sub-gates, whereas the other of the first and second gate terminals is coupled to the common upper sub-gate and not the other lower sub-gate. In one embodiment, the first transistor serves as a storage transistor and the second transistor serves as a select transistor. The first gate terminal 184 is coupled to the common upper sub-gate and is coupled to the control gate line. The second gate terminal 186 is coupled to a lower sub-gate and is coupled to a wordline. In other embodiments, the coupling of the terminals may be arranged in other suitable configurations.

FIG. 1b shows a cross-sectional view of an embodiment of a memory cell 100 as shown in FIG. 1a. There is shown a substrate 105 which includes a cell region 110. The cell region is isolated from other regions by isolation regions 180. The isolation regions, for example, are shallow trench isolation (STI) regions. Other types of isolation regions may also be employed. The cell region, in one embodiment, includes a doped well 115. The doped well includes dopants of a second polarity type.

First and second transistors 120 and 140 are disposed in the cell region. In one embodiment, the first transistor 120 serves as a storage transistor. The first transistor includes a first lower sub-gate 127 disposed on the substrate. The first lower sub-gate, for example, serves as a floating gate. The first lower sub-gate includes, for example, polysilicon. Forming the first lower sub-gate using other types of gate electrode materials may also be useful.

An intergate dielectric layer 160 separates the first lower sub-gate 127 from a common upper sub-gate 130. The intergate dielectric layer, for example, may include a dielectric stack having multiple dielectric layers. For example, the dielectric stack may include an oxide-nitride-oxide (ONO) stack. Other types of intergate dielectric layers or stacks may also be used. For example, the intergate dielectric layer may include $SiO_2$ or a three-layer stack with one of the layers having $HfO_x$ or $Al_2O_3$. Separating the bottom of the first lower sub-gate 127 from the substrate is a gate dielectric layer 150. In one embodiment, the gate dielectric layer includes thermal silicon oxide. The gate dielectric layer may include two or more gate dielectric layers. Other types of gate dielectric layers may also be used.

First and second doped or diffusion regions 133 and 134 are provided adjacent to the first transistor. The first and second doped regions include dopants of a first polarity type, which is the opposite of the second polarity type. The first and second doped regions 133 and 134 form source/drain (S/D) diffusion regions of the first transistor. In one embodiment, the second doped region 134 includes first and second sub-portions 134a and 134b while the first doped region 133 includes a first sub-portion 133a and is devoid of a second sub-portion. The first sub-portions 133a and 134a are lightly doped portions (e.g., $x^-$, where x may be the polarity type of dopants such as p or n) and the second sub-portion 134b is a heavily doped portion (e.g., $x^+$). The lightly doped portions, for example, include lightly doped drains (LDDs) or double diffused drains (DDDs). In one embodiment, the lightly doped portions include DDDs. The DDDs, for example, include a depth greater than the second sub-portion 134b. For example, a second sub-portion is encompassed within a DDD.

In one embodiment, first and second buried doped regions 131 and 132 are provided in the first transistor region. The buried doped regions include dopants of the first polarity type. The buried doped regions include an intermediate dopant concentration (e.g., x) of the first polarity type dopants. The intermediate dopant concentration, in one embodiment, is between the dopant concentrations of the lightly and heavily doped portions (e.g., $x^-<x<x^+$). Providing other dopant concentrations for the buried doped regions may also be useful. The buried doped regions are provided adjacent to the first transistor. In one embodiment, the buried doped regions overlap with the first and second doped regions and extend beneath the first transistor. In one embodiment, one of the buried doped regions extends beneath a tunneling window 152 in the gate dielectric layer.

In one embodiment, one of the buried doped regions extends beneath the first lower sub-gate 127 beyond the tunneling window 152 in the gate dielectric layer. The buried doped regions provide charge carriers for the first transistor through the tunneling window to facilitate charge injection into and out of memory cell 100. The buried doped regions also determine the effective channel length of the first lower sub-gate as well as the source resistance of the cell. In one embodiment, the implantation dosage of the buried doped regions is about E14 $cm^{-2}$, the implantation dosage of the lightly doped regions, such as LDDs or DDDs, is about E13 $cm^{-2}$, and the implantation dosage of the heavily doped regions is about E15 $cm^{-2}$. Providing the different doped regions with other dopant concentrations may also be useful.

As for the second transistor 140, it serves as a select transistor. The second transistor includes a second lower sub-gate 147 disposed on the substrate. The second lower sub-gate, for example, serves as a select gate. The second lower sub-gate includes, for example, polysilicon. As in the case of the first lower sub-gate 127, an intergate dielectric layer 160 is disposed over the second lower sub-gate 147. In one embodiment, the intergate dielectric layer 160 is common to the first and second transistors. For example, the same intergate dielectric layer 160 covers the first and second lower sub-gates as shown in FIG. 1b.

In one embodiment, a common upper sub-gate 130 is disposed over the substrate, covering the first and second lower sub-gates and the lower sub-gates are isolated from the common upper sub-gate by the common intergate dielectric layer. As such, both the first and second transistors have respective first and second lower sub-gates but share a common upper sub-gate 130. The portion of the common upper sub-gate overlying the first lower sub-gate, for example, serves as a control gate for the first transistor. The common upper sub-gate includes, for example, polysilicon. Forming the common upper sub-gate and lower sub-gates using other suitable types of gate electrode materials may also be useful. By having a common upper sub-gate 130 for both the first and second transistors, this will reduce the size of the memory cell as well as simplify processing steps as there is no need to pattern and form two distinct gate stacks.

First and second doped or diffusion regions 133 and 136 are provided adjacent to the second lower sub-gate. The first and second doped regions include dopants of the first polarity type. The first and second doped regions 133 and 136 form S/D diffusion regions of the second transistor. The first doped region 133, for example, is the first doped region which is common to both the first and second transistors. In one embodiment, the second doped region 136 includes first and second sub-portions 136a and 136b while the first doped region 133 includes a first sub-portion 133a and is devoid of a second sub-portion. The first sub-portions 133a and 136a are lightly doped portions (e.g., $x^-$, where x may be the polarity type of dopants such as p or n) and the second sub-portion 136b is a heavily doped portion (e.g., $x^+$). The lightly doped portions, for example, include LDDs or DDDs. In one embodiment, the lightly doped portions include DDDs. The DDDs, for example, include a depth greater than the second sub-portion 136b. For example, a second sub-portion is encompassed within a DDD.

In one embodiment, the second diffusion region of the first transistor serves as the first cell terminal and the second diffusion region of the second transistor serves as the second cell terminal of the memory cell. The gate of the first transistor, which is formed by the common upper sub-gate 130 and the first lower sub-gate 127, serves as the first gate terminal and the gate of the second transistor, which is formed by the common upper sub-gate 130 and the second lower sub-gate 147, serves as the second gate terminal of the memory cell.

Dielectric spacers 156 may be optionally provided on sidewalls of the common upper sub-gate 130. The spacers may include silicon nitride. Other types of spacer materials may also be employed. For example, the spacers may include multiple spacers. As shown, the need for spacers on sidewalls of the first and second lower sub-gates is eliminated by having a common upper sub-gate 130. This enables further reduction of the size of the memory cell as only one set of spacers on either side of the common upper sub-gate 130 needs to be formed. The smaller cell size achieved will be about 25% reduction in the overall area occupied by the memory cell as compared to conventional memory cells. A dielectric etch stop layer 181 may optionally be provided on the surface of the common upper sub-gate 130. The etch stop layer may include silicon nitride. Other types of etch stop materials may also be used to form the etch stop layer.

In one embodiment, the first sub-portions 134a and 136a of the second doped regions of transistors 120 and 140 both extend beneath the common upper sub-gate 130 to the lower sub-gates. As shown, inner edges of the first sub-portions 134a and 136a are about aligned with sidewalls of the first and second lower sub-gates, respectively. The second sub-portions 134b and 136b of the transistors 120 and 140 are about aligned with the outer edge of the spacers on the left and right, respectively, of the common upper sub-gate 130. In embodiments without spacers, the second sub-portions 134b and 136b are about aligned with the respective sidewalls of the common upper sub-gate 130. First sub-portion 133a of the first doped region 133 is disposed in between the first and second lower sub-gates 127 and 147, and the first sub-portion 133a is about aligned with the right and left sidewalls, respectively of the first and second lower sub-gates. Other configurations of the doped regions may also be useful.

An interlevel dielectric (ILD) layer 190 may be provided on the substrate covering the transistors. The interlevel dielectric layer may serve as a premetal dielectric (PMD) layer. Various materials may be used to form the PMD layer, for example, BPSG, PSG, HDP oxide, HARP, TEOS or a combination thereof. Other dielectric materials may also be useful. Contacts are formed in the PMD layer to provide connections to the different terminals of the memory cell. The contacts, for example, include a conductive material such as tungsten. Other types of conductive materials may also be employed. A contact may include a contact liner. Various types of contact liners may be used. For example, the contact liner may be titanium (Ti), titanium nitride TiN or a combination thereof. In some embodiments, the liner includes a composite liner having a combination of Ti and TiN, such as Ti/TiN or Ti/TiN/Ti. Other types of liners may also be employed.

In one embodiment, first and second contacts 192 and 198 are provided in the PMD layer to couple to first and second cell terminals. The first terminal is coupled to ground and the second terminal is coupled to a bitline. Third and fourth contacts 194 and 196 are provided in the PMD layer to couple to first and second gate terminals. In one embodiment, the third contact 194 is coupled to the portion of the common upper sub-gate of the first transistor and the fourth contact 196 is coupled to the second lower sub-gate 147 of the second transistor and is isolated from the common upper sub-gate to prevent electrical short. The third contact 194 is coupled to a control gate line and the fourth contact 196 is coupled to a wordline.

Figure 1C:
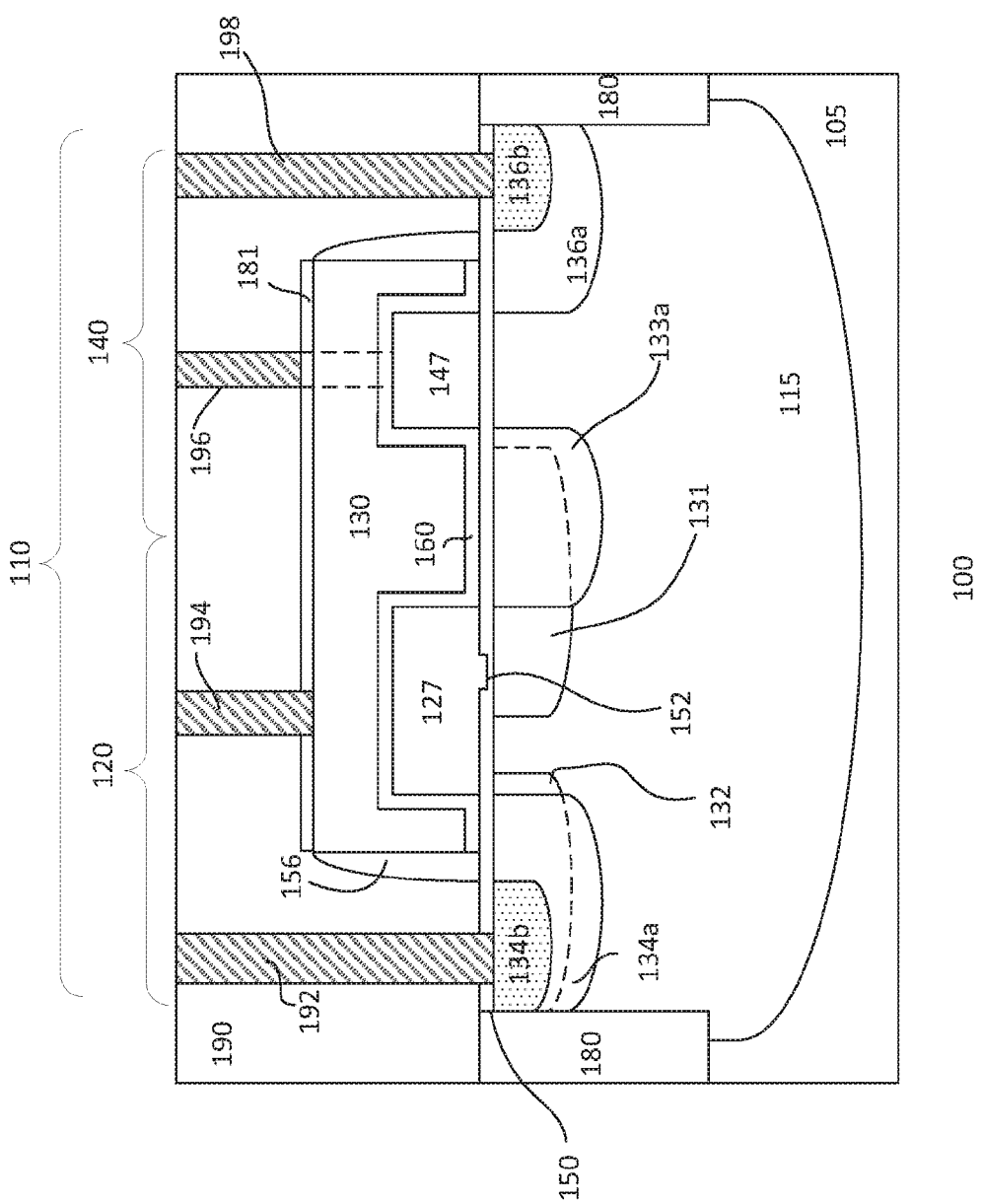

FIG. 1c shows a cross-sectional view of another embodiment of a memory cell 100. As shown, the memory cell 100 is similar to that described in FIG. 1b except that a portion of the fourth contact 196 coupled to the second lower sub-gate 147 of the second transistor 140 is illustrated with dotted lines.

As described, the fourth contact 196 is coupled to the second lower sub-gate 147 of the second transistor and is isolated from the common upper sub-gate to prevent electrical short. This can be achieved by having a portion of the second lower sub-gate 147 exposed and extended beyond the common upper sub-gate 130 such that the fourth contact 196 couples to exposed portion of the second lower sub-gate. For example, FIG. 1di shows a simplified top view of the memory cell of FIG. 1b which illustrates a portion of the lower sub-gate 147 extends at the front of the common upper sub-gate 130 of which the fourth contact 196 lands on top of the exposed portion of the lower sub-gate. FIG. 1d2, for example, shows a simplified top view of the memory cell of FIG. 1c which illustrates a portion of the lower sub-gate 147 extends at the back of the common upper sub-gate of which the fourth contact 196 lands on top of the exposed portion of the lower sub-gate. Thus, a portion of the fourth contact 196 is presented as dotted lines as shown in FIG. 1c. Other suitable techniques or configurations to isolate the fourth contact from the common upper sub-gate may also be employed.

Table 1 shows an exemplary embodiment of bias conditions of the different terminals for different operations of the memory cell shown in FIGS. 1a-1c. Operating the memory cell using other bias conditions may also be useful.

TABLE 1

| terminals | operations | | |
|---|---|---|---|
| | Erase | Write | Read |
| First cell terminal or Source (array ground) | 0 V | Float | 0 V |
| Second cell terminal (bitline) | Float | 13 V | Vt |
| First gate terminal (control gate) | 14 V | 0 V | 0.8 V |
| Second gate terminal (wordline) | 15 V | 15 V | 3.3 V |
| Substrate | 0 V | 0 V | 0 V |

A tunneling window is defined in the memory cell and the buried doped regions provide charge carriers for the first transistor through the tunneling window to facilitate charge injection into and out of memory cell 100 by Fowler-Nordheim (FN) tunneling.

In one embodiment, a charge pump circuit (not shown) which generates a voltage used in program or erase memory accesses of the memory cell is coupled to the memory cell. The charge pump circuit, in one embodiment, is configured in such a way that it can vary the output current to match the memory array size and leakage performance of the memory cell of FIGS. 1a-1c. To reduce the voltage stress on the memory cell, the charge pump may be designed for a smaller programming voltage, such as but not limited to about 11.5 V. The charge pump circuit is designed such that it can reduce the supply current for a smaller array size of the memory cell of FIGS. 1a-1c as well as to adjust the ramp up speed of output voltage to reduce damage to the memory device during programming and erasing operations.

A plurality of memory cells can be arranged to form a memory array. For example, the plurality of memory cells may be arranged in rows and columns. The memory cells, for example, include memory cells 100 as described in FIGS. 1a-1c. A row corresponds to, for example, a wordline (WL) and a column corresponds to a bitline (BL) of the array. Control gate lines are also provided to couple to the control gate terminal.

Figure 2C:
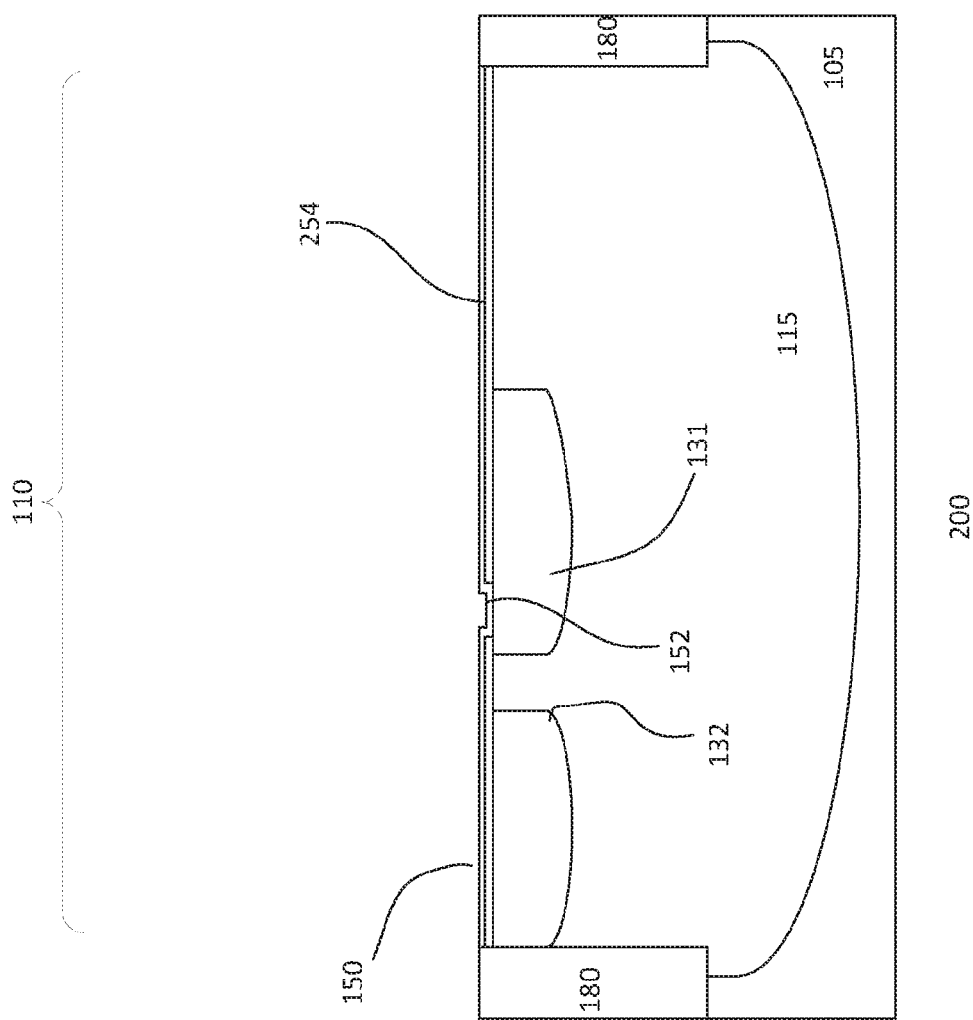

FIGS. 2a-2k show cross-sectional views of an embodiment of a process 200 for forming a device or IC. Referring to FIG. 2a, a substrate 105 is provided. The substrate can include a silicon substrate, such as a lightly p-type doped substrate. Other types of substrates, including silicon germanium or silicon-on-insulator (SOI), are also useful.

As shown in FIG. 2a, a memory cell region 110 of the device is shown. However, it is understood that the substrate may include various types of regions (not shown). For example, the substrate may include other cell regions of an array region in which memory cells are formed and logic regions in which logic devices are formed. The logic regions, for example, may include regions for devices, such as support devices for accessing the memory array. Additionally, the logic regions may include other types of devices, depending on the type of IC formed. The logic region, for example, may include regions for different voltage devices. For example, the logic region may include regions for high voltage devices, medium voltage devices and low voltage devices. Other configurations of logic regions may also be useful.

The cell region is separated from other regions by isolation regions 180. The isolation regions include, for example, STIs. Various processes can be employed to form the STI regions. For example, the substrate can be etched using etch and mask techniques to form trenches which are then filled with dielectric materials such as silicon oxide. Chemical mechanical polishing (CMP) can be performed to remove excess oxide and provide a planar substrate top surface. The STI regions can be formed, for example, prior to or after the formation of doped wells. Other processes or materials can also be used to form the STIs. In other embodiments, the isolation may be other types of isolation regions. The depth of the STIs may be, for example, about 3000-4500 Å. Other depths for the STIs may also be useful.

A doped well 115 is formed in the cell region. The doped well, in one embodiment, includes dopants of a second polarity type. The depth of the doped well, for example, may be about 10000-25000 Å. Providing doped wells of other depths may also be useful. The doped well of the second polarity dopants is used to form first polarity type devices. In one embodiment, the doped well includes a p-type doped well to form n-type devices. Alternatively, the doped well includes an n-type doped well to form p-type devices. The doped well may be formed by implanting appropriate dopants with the desired dose and power into the substrate. The dopant type, dose and power may depend on the type of device to be formed.

In one embodiment, the doped well includes a p-well. The doped well may be formed by performing a chain of 3 implants at different energies. For example, a first boron (B) implant is performed at a dose about E12 $cm^{-2}$ at an energy level about 400 keV, a second B implant is performed at a dose about E12 $cm^{-2}$ at an energy level about 150 keV and at a third B implant is performed at a dose about E12 $cm^{-2}$ at an energy level about 20 keV. Other techniques for forming the doped well may also be employed.

The substrate may include other types of device regions (not shown) for supporting other types of devices. For example, the substrate may include p-type and n-type devices, such as high, medium and low voltage p-type and n-type devices. Various types of n-type and p-type wells are provided for these devices. The various wells may be formed by separate implantation processes using implant masks. P-type dopants can include boron (B), aluminum (Al), indium (In) or a combination thereof, while n-type dopants can include phosphorus (P), arsenic (As), antimony (Sb) or a combination thereof.

In FIG. 2b, the cell region is prepared with first and second buried doped regions 131 and 132. The buried doped regions include dopants of the first polarity type. For example, the buried doped regions include n-type dopants to form an n-type memory cell. The buried doped region serves as a supply of charge for the storage or control transistor of the memory cell. In one embodiment, the buried doped regions are formed by ion implantation. For example, arsenic (As) is implanted at a dose about 4E14-9E14 $cm^{-2}$ at an energy of about 15-60 keV. Forming the buried doped regions using other types of dopants or implant parameters may also be useful.

A dielectric layer 253 is formed on the surface of the substrate in the cell region. In one embodiment, the dielectric layer serves as the gate dielectric layer for the transistors of the cell. The dielectric layer, for example, includes thermal silicon oxide. For example, the dielectric layer is formed by a wet oxidation followed by annealing the substrate in an oxidizing ambient. The thickness of the dielectric layer is formed to an intermediate thickness. The temperature of the wet oxidation can be, for example, about 750-900° C. The annealing can be, for example, performed at a temperature of about 1000° C. The thickness of the dielectric layer may be, for example, about 150-220 Å. Other types of gate dielectric materials or thicknesses or process conditions for forming the gate dielectric may also be useful. For example, the gate dielectric material may include other types of gate dielectric materials and/or be formed by other types of processes, such as chemical vapor deposition (CVD).

The dielectric layer is patterned to form an opening 251, exposing the substrate. Patterning of the opening may be achieved using mask and etch techniques. For example, a mask, such as photoresist, may be selectively patterned to create an opening to expose portions of the dielectric layer. An anisotropic etch, such as a reactive ion etch (RIE), may be performed to remove exposed portions of the dielectric layer to expose the substrate. Other patterning techniques may also be used. For example, a wet etch using etchants such as BOE, HF or a combination thereof can be employed. In addition, a combination of RIE and wet etch can also be useful. Other techniques for forming the opening may also be useful.

As shown in FIG. 2c, a second dielectric layer 254 is formed in the cell region. The second dielectric layer includes, in one embodiment, thermal silicon oxide. For example, the dielectric layer is formed by a wet oxidation at a temperature of about 750-850° C. The annealing may be performed after the wet oxidation. The annealing can be, for example, performed at a temperature of about 900-1000° C. The thickness of the second dielectric layer may be, for example, about 60-90 Å. Other types of dielectric materials or thicknesses or process conditions for forming the second dielectric layer may also be useful. For example, the dielectric material may include other types of gate dielectric materials and/or be formed by other types of processes, such as CVD. For example, the dielectric material may be nitrided oxide of ISSG oxide.

The second dielectric layer fills the opening 251 and forms over the dielectric layer 253. The dielectric layers form gate dielectric layer 150 on the surface of the substrate. A tunneling window 152 is formed in the first transistor region which has a thickness equal to about the thickness of the second dielectric layer.

Figure 2D:
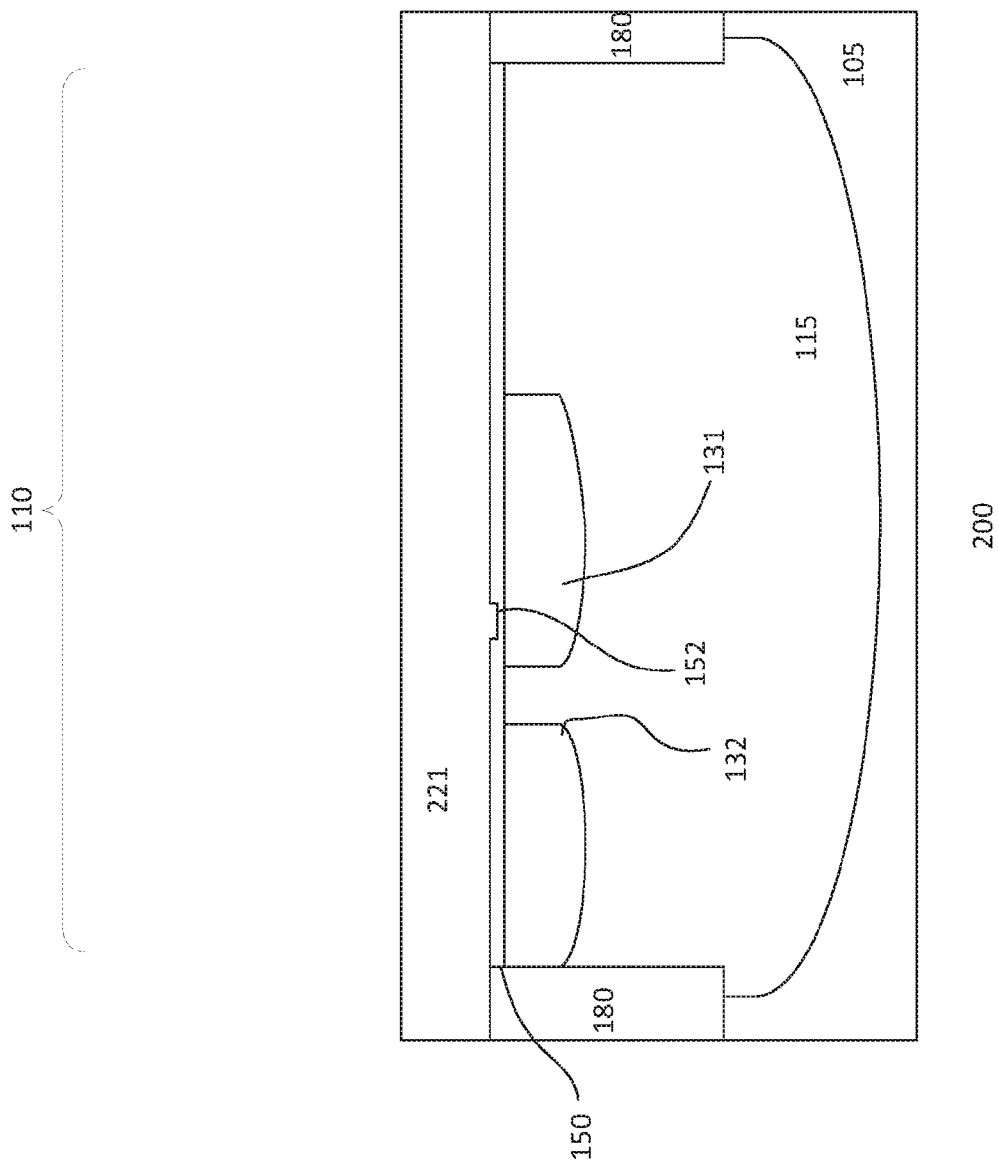

Referring to FIG. 2d, a first sub-gate electrode layer 221 is formed on the substrate over the gate dielectric layer. The first sub-gate layer includes, in one embodiment, polysilicon. The first sub-gate electrode layer can be formed as an amorphous or non-amorphous layer. The first sub-gate electrode may be doped. Various techniques may be employed to dope the first sub-gate electrode, for example, insitu doping or ion implantation. Providing an undoped first sub-gate electrode layer may also be useful. Other types of gate electrode materials may also be useful. The thickness of the first sub-gate electrode layer may be, for example, about 800-3000 Å. Other thicknesses may also be useful. To form the first sub-gate electrode layer, techniques such as CVD, can be used. Other techniques may also be useful.

In FIG. 2e, the first sub-gate layer is patterned. In one embodiment, the first sub-gate layer is patterned to form first and second lower sub-gates 127 and 147 of the first and second transistors of the cell. Techniques, such as mask and etch, can be used. For example, a photoresist layer is formed over the gate layer and patterned, exposing portions of the first sub-gate layer. An anisotropic etch, such as a RIE, is performed to remove exposed portions of the first sub-gate layer. To improve lithographic resolution, an anti-reflective coating (ARC) can be provided beneath the photoresist. Other techniques for patterning the first sub-gate layer may also be useful. For example, a hard mask may be used to pattern the first sub-gate layer. As shown, the first lower sub-gate 127 is disposed over the tunneling window 152 and the separation distance between the first and second lower sub-gates is reduced as there is no need for spacer formation on sidewalls of the first and second lower sub-gates and no heavily doped region is required to be formed in portion of the substrate between the first and second lower sub-gates as will be described later. The separation distance between the first and second lower sub-gate is, for example, about 160 nm to 200 nm. Other suitable separation distance may also be useful.

Figure 2F:
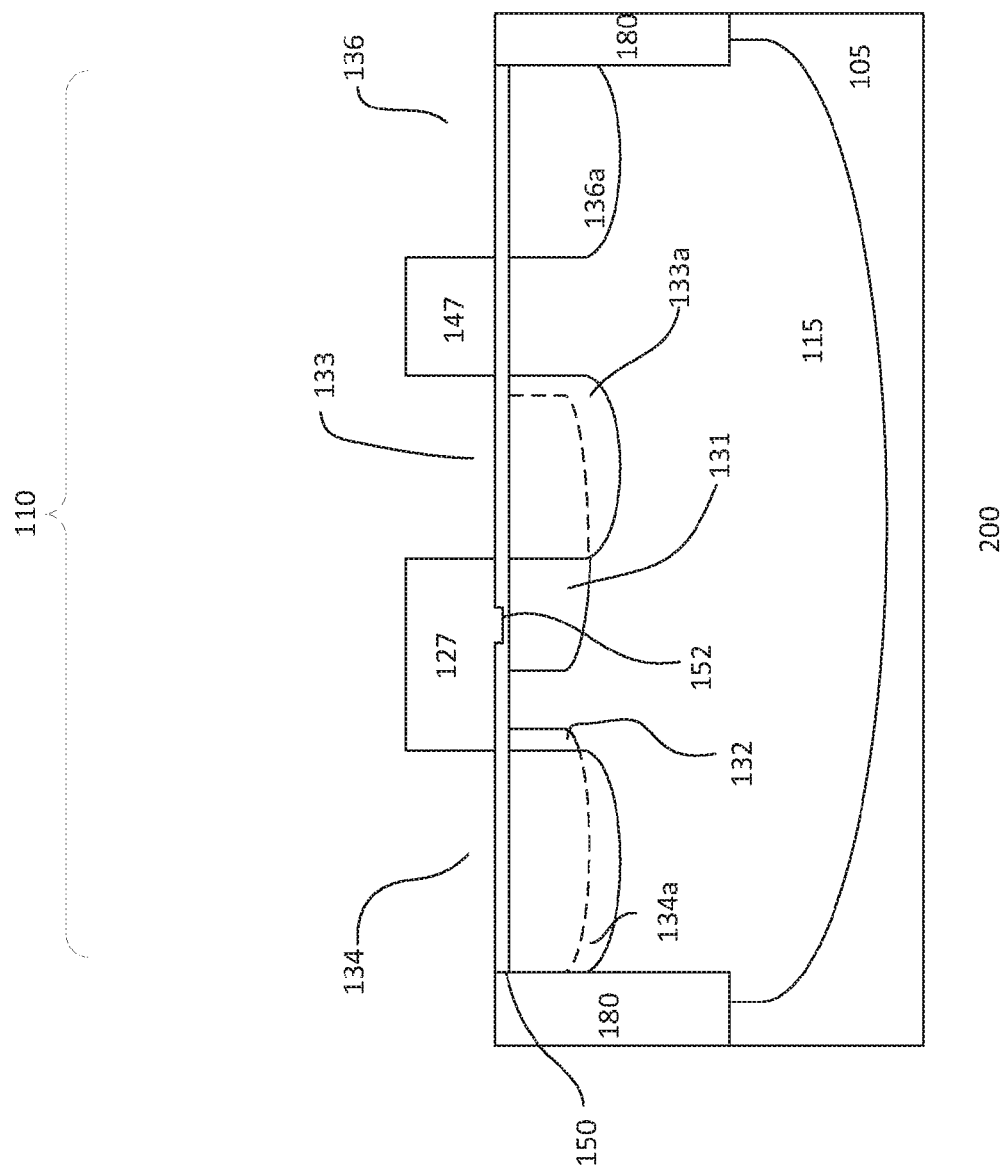

Referring to FIG. 2f, first and second doped regions 133, 134 and 136 of the first and second transistors are formed. The doped regions can be formed by implanting first type dopants into the substrate. In one embodiment, the doped regions can be self-aligned using the lower sub-gates and isolation regions as implant masks. In one embodiment, the first sub-portions 133a, 134a and 136a of the first and second doped regions of the first and second transistors are formed. In one embodiment, the first sub-portions are formed by ion implantation at a dose about E13 cm' at an energy level about 25-80 keV. The implant may be performed with a tilt angle. The tilt angle may be, for example, up to about 45°. Performing the implant at other tilt angles, including performing un-tilted implants (e.g., at 0°), may also be useful. In the case of an n-type device, Ph dopants may be implanted. Other types of dopants or implant parameters may also be useful. As shown, a common first doped region is provided for the first and second transistors.

Figure 2G:
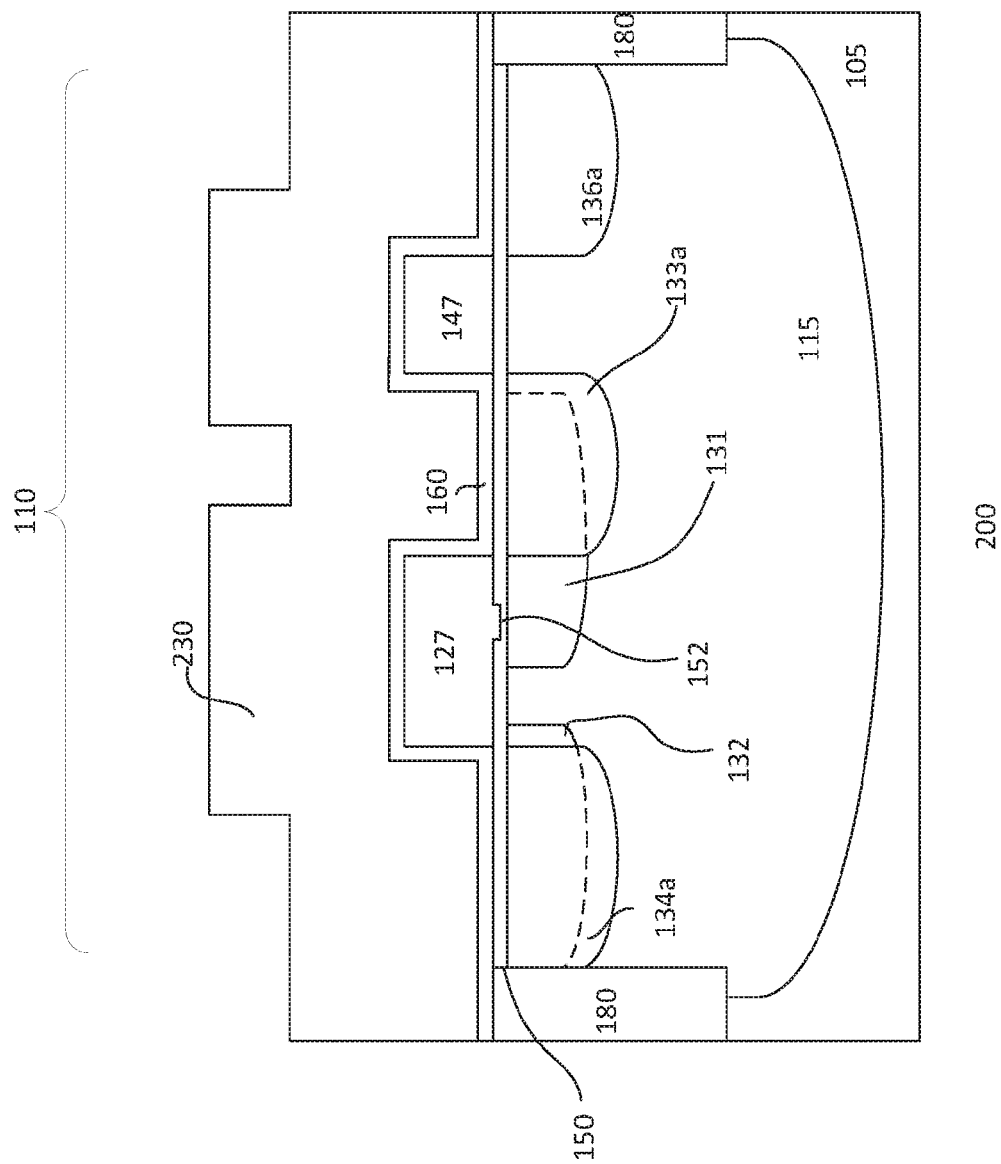

Referring to FIG. 2g, an intergate dielectric layer 160 is formed on the substrate and over the first and second lower sub-gates 127 and 147 and the substrate, such as the gate dielectric layer 150. In one embodiment, the intergate dielectric layer includes a dielectric stack, such as an ONO stack. Other types of intergate dielectric and dielectric stacks may also be useful. The ONO stack includes, for example, a bottom oxide layer, a nitride layer and a top oxide layer. Various techniques may be employed to form the dielectric stack. For example, the different layers of the dielectric stack may be formed by LPCVD.

A second sub-gate electrode layer 230 is deposited on the substrate, covering the intergate dielectric layer. The second sub-gate layer 230, in one embodiment, includes polysilicon. The second sub-gate electrode layer can be formed as an amorphous or non-amorphous layer. The second sub-gate electrode layer can be doped or undoped. Other types of gate electrode materials are also useful. The thickness of the second sub-gate electrode layer is, for example, about 800-2500 Å. Other suitable thicknesses may also be useful. To form the second sub-gate electrode layer, techniques, such as CVD, can be used. Other suitable techniques are also useful.

Figure 2H:
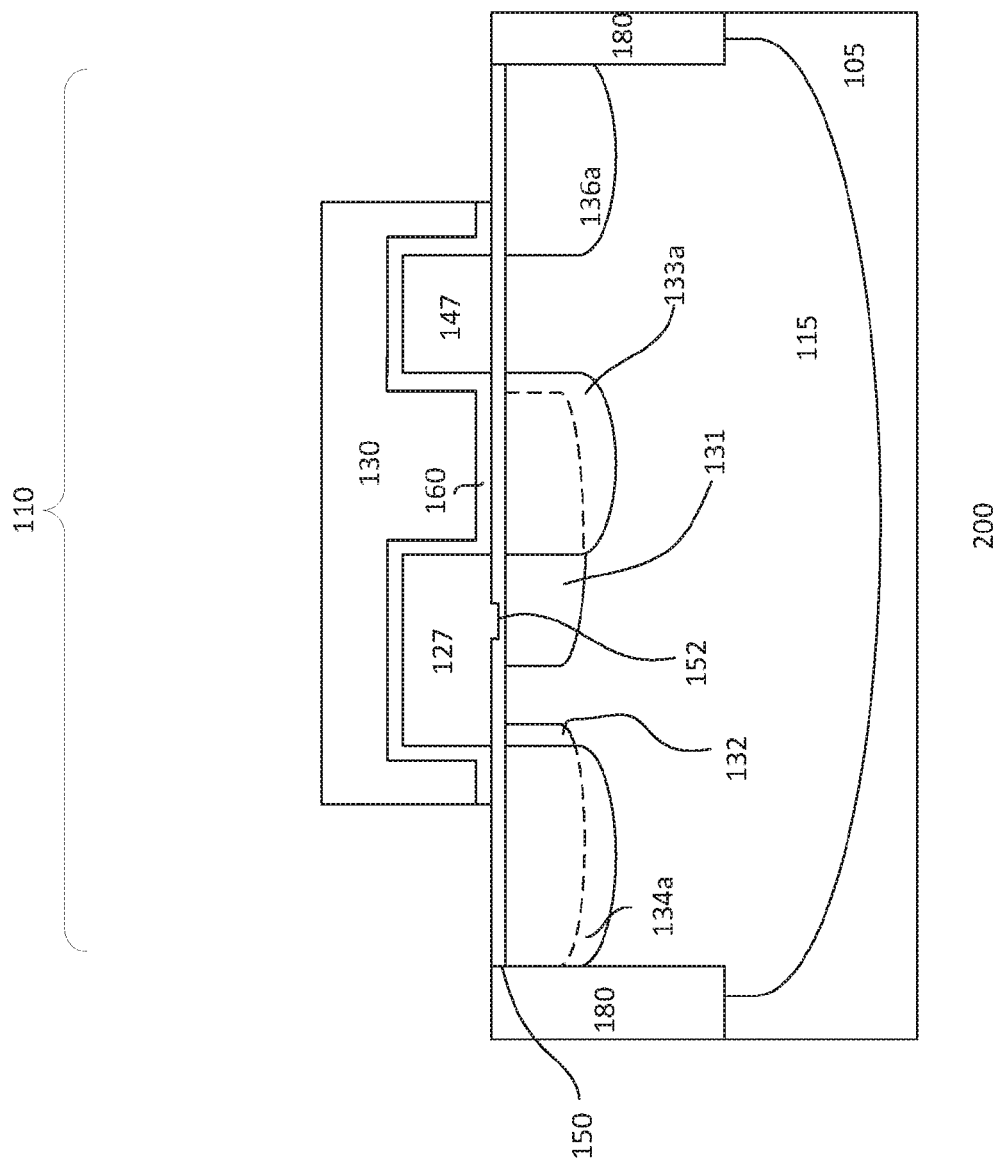

Referring to FIG. 2h, the second sub-gate electrode layer 230 is patterned to form the common upper sub-gate 130 of the first and second transistors 120 and 140 of the memory cell. As shown, the common upper sub-gate 130 wraps around or surrounds the first and second lower sub-gates 127 and 147. Techniques, such as mask and etch, can be used to define the common upper sub-gate 130 and the intergate dielectric 160. For example, a photoresist layer is formed over the second sub-gate electrode layer and patterned, exposing portions of the second sub-gate electrode layer. An anisotropic etch, such as a RIE, is performed to remove exposed portions of the second sub-gate electrode and intergate dielectric layers. To improve lithographic resolution, an ARC can be provided beneath the photoresist. Other suitable techniques for patterning the second sub-gate layer 230 and intergate dielectric layer 160 may also be useful. As shown, the separation distance between the first sidewall of the common upper sub-gate with the nearest sidewall of the first lower sub-gate is about 80-120 nm and the separation distance between the second sidewall of the common upper sub-gate with the nearest sidewall of the second lower-gate is about 80-120 nm. Other suitable separation distances may also be useful as long as the common upper sub-gate is defined such that it sufficiently covers the lower sub-gates.

Figure 2I:
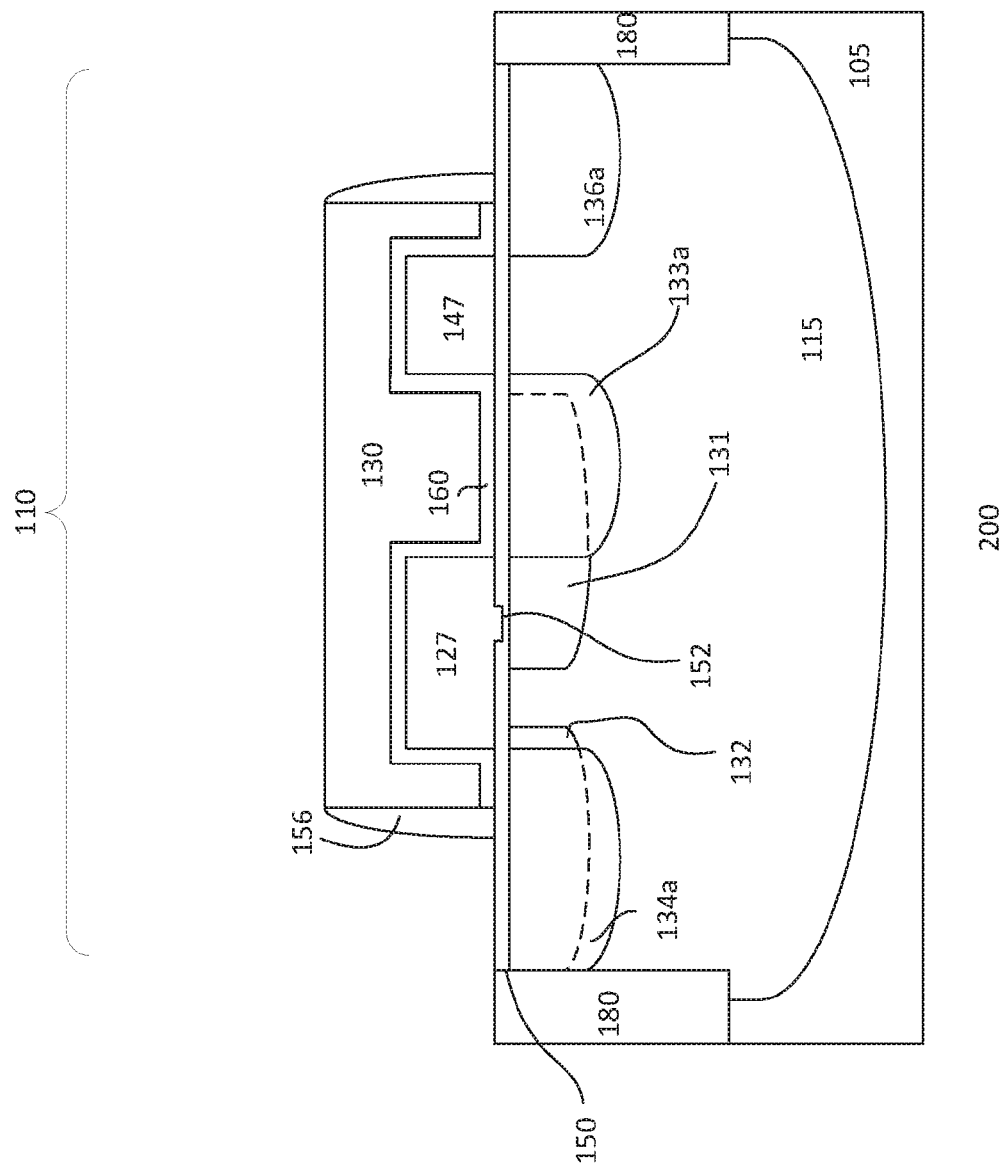

The process continues to form the device in FIG. 2i. For example, the additional processing can include removing of the mask layer and forming of the gate sidewall spacers 156 of common upper sub-gate 130. The gate sidewall spacers, for example, include nitride. Other types of spacer materials may also be useful. To form sidewall spacers, a spacer dielectric layer is deposited on the substrate. The spacers can be formed by using various techniques, such as plasma enhanced chemical vapor deposition (PECVD). Other techniques to form the spacer dielectric layer may also be useful. The spacer dielectric layer is subsequently anisotropically etched, such as by RIE, to remove horizontal portions, leaving non-horizontal portions on the sidewalls as the spacers.

Figure 2J:
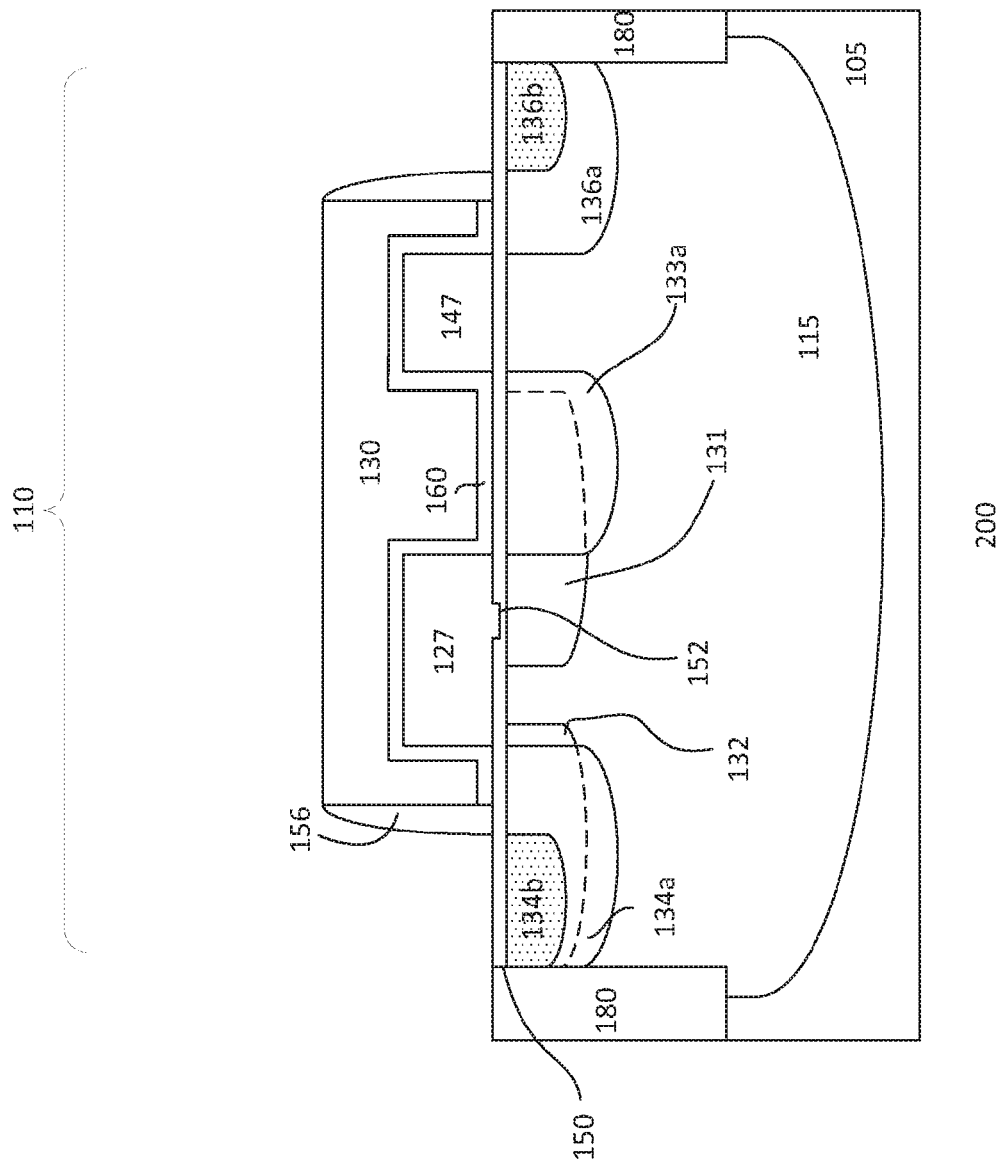

Referring to FIG. 2j, second sub-portions 134b and 136b are formed. The second sub-portions can be formed by implanting first type dopants into the substrate. In one embodiment, the second sub-portions are heavily doped regions and are self-aligned using the spacers and isolation regions as implant mask. In one embodiment, the second sub-portions 134b and 136b of the second doped regions of the first and second transistors are formed. In one embodiment, an ion implantation is performed at a dose of about $E15 \text{ cm}^{-2}$ to form the second sub-portions. As shown, heavily doped second sub-portion is not formed in the portion of the substrate between the first and second lower sub-gates as this portion of the substrate is covered by the common upper sub-gate 130 during the ion implantation process. In the case of an n-type device, Ph dopants may be implanted. Other types of dopants or implant parameters may also be useful to form the second sub-portions. The second sub-portions serve as source/drain (S/D) regions or cell terminals of the memory cell.

The process may continue by forming silicide contacts such as Co-silicide, W-silicide, Ti-silicide, Ni-silicide or a combination thereof on the surface of the substrate in the S/D regions and the surface of the gate electrode. Other materials of silicide contacts may also be useful. The silicide contacts may also be formed in other parts of the device.

Figure 2K:
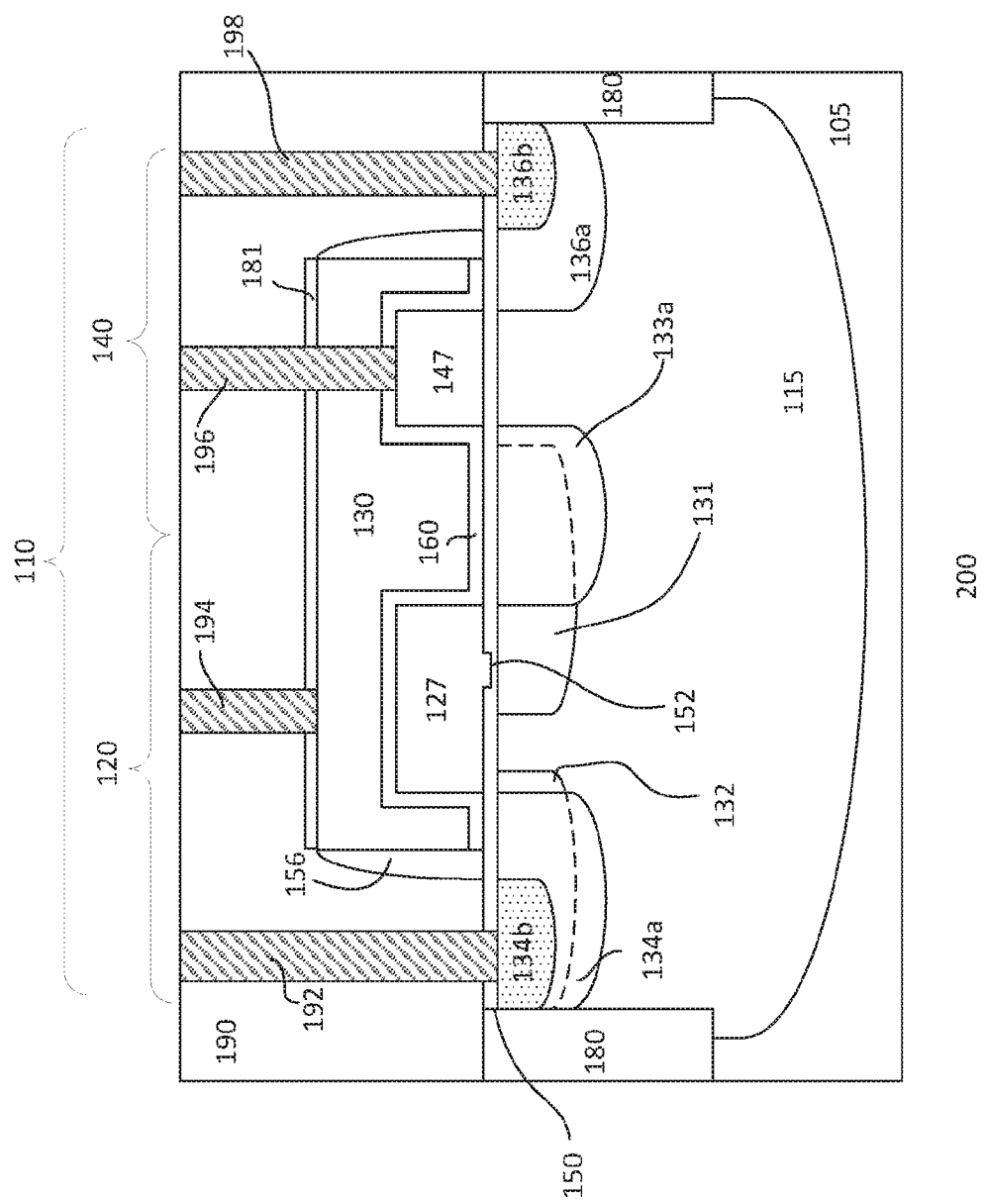

The process further continues in FIG. 2k to form the PMD layer 190, and contacts 192, 194, 196 and 198 to the terminals of the cell. The contacts may be formed by forming via holes in the PMD layer and filling the via holes with a conductive material, such as but not limited to tungsten. Additional processes may be performed thereafter. For example, the additional processes may include forming of one or more interconnect levels, final passivation, dicing, assembly and packaging. Other processes are also useful. For example, other components, such as low voltage, medium voltage, and high voltage I/O devices can be formed prior to forming the interconnections. The memory cells can be formed as a memory device or embedded into a part of ICs.

The embodiments as described in the present disclosure result in advantages. For example, the process as described in FIGS. 2a-2k employing a common upper sub-gate for first and second transistors allow a memory cell with a smaller cell size to be achieved, which is about 25% reduction in the overall area occupied by the memory cell as compared to conventional memory cells. The smaller memory cell size is accomplished with a simplified and cost efficient process as there is no need to pattern and form two distinct gate stacks for the first and second transistors. Configuration of the memory cell as described, for example, avoids spacer formation on sidewalls of the first and second lower sub-gates and avoids the need to form heavily doped region in portion of the substrate between the first and second lower sub-gates, allowing the memory cell size to be reduced. In addition, the process increases margin for poly etch process due to topography reduction. Moreover, the required voltage for programming is also reduced. This also reduces the voltage stress on the memory cell.

Furthermore, the embodiments also include the provision of a charge pump circuit (not shown) which is configured with selectable output current or pump size to match the memory array size and leakage performance of the memory cell of FIGS. 1a-1c. The charge pump circuit is also designed with selectable voltage ramping speed or oscillator frequency to avoid over stress, thereby reducing damage to the memory device during programming and erasing operations.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
    providing a substrate prepared with a cell area separated by other active areas by isolation regions;
    forming first and second lower sub-gates of first and second transistors in the cell area; and
    forming a common upper sub-gate of the first and second transistors, wherein the common upper sub-gate and the first and second lower sub-gates are separated by an intergate dielectric layer and the common upper sub-gate surrounds the first and second lower sub-gates.

2. The method of claim 1 comprising forming a gate dielectric layer that separates the first lower sub-gate from a channel of the first transistor and the second lower sub-gate from a channel of the second transistor, wherein the gate dielectric layer comprises a tunneling window under the first lower sub-gate.

3. The method of claim 2 comprising forming first and second intermediately doped buried regions in the substrate, wherein the buried doped regions extend beneath the first lower sub-gate.

4. The method of claim 2 wherein the first and second lower sub-gates and the common upper sub-gate are formed by:
    forming a first sub-gate electrode layer on the substrate over the gate dielectric layer;
    patterning the first sub-gate electrode layer to define the first and second lower sub-gates;
    forming a second sub-gate electrode layer over the first and second lower sub-gates and the intergate dielectric layer;
    patterning the second sub-gate electrode layer to form the common upper sub-gate which is a single and continuous gate layer covering the first and second lower sub-gates.

5. The method of claim 1 comprising forming first and second doped regions adjacent to the first and second transistors that form source/drain (S/D) diffusion regions of the first and second transistors.

6. The method of claim 5 wherein the first doped region is common to both the first and second transistors.

7. The method of claim 6 comprising forming lightly doped first sub-portions of the first and second doped regions of the first and second transistors, wherein the first sub-portions are self-aligned to the lower sub-gates.

8. The method of claim 7 comprising forming dielectric spacers on first and second sidewalls of the common upper sub-gate.

9. The method of claim 8 comprising forming heavily doped second sub-portions in the second doped regions of the first and second transistors adjacent to the first and second sidewalls of the common upper sub-gate, wherein the second sub-portions have a depth shallower than the first sub-portions.

10. The method of claim 9 wherein a portion of the substrate between the first and second lower sub-gates is devoid of a heavily doped second sub-portion.

11. The method of claim 1 wherein the intergate dielectric layer is common to the first and second transistors and comprises a dielectric stack having multiple dielectric layers.

12. The method of claim 2 wherein the gate dielectric layer comprises thermal silicon oxide.

13. The method of claim 4 comprising forming first and second contacts in a premetal dielectric layer to couple to first and second cell terminals.

14. The method of claim 13 comprising forming a third contact which couples a portion of the common upper sub-gate above the first lower sub-gate to a control gate line and a fourth contact which couples the second lower sub-gate to a wordline.

15. The method of claim 13 comprising forming a third contact which couples a portion of the common upper sub-gate above the first lower sub-gate and a fourth contact is coupled to the second lower sub-gate and is isolated from the common upper sub-gate.

16. The method of claim 15 comprising exposing a portion of the second lower sub-gate and extending beyond the common upper sub-gate.

17. The method of claim 5 wherein the second doped region comprises first and second sub-portions while the first doped region comprises a first sub-portion and is devoid of a second sub-portion.

18. The method of claim 7 wherein the first sub-portions are formed by ion implantation which is performed with a tilt angle.

19. A method of forming a device comprising:
   providing a substrate prepared with a cell area separated by other active areas by isolation regions;
   forming first and second lower sub-gates of first and second transistors in the cell area;
   forming a gate dielectric layer that separates the first lower sub-gate from a channel of the first transistor and the second lower sub-gate from a channel of the second transistor, wherein the gate dielectric layer comprises a tunneling window under the first lower sub-gate;
   forming a common upper sub-gate of the first and second transistors, wherein the common upper sub-gate and the first and second lower sub-gates are separated by an intergate dielectric layer and the common upper sub-gate surrounds the first and second lower sub-gates; and
   forming first and second intermediately doped buried regions in the substrate, wherein the buried doped regions extend beneath the first lower sub-gate.

20. The method of claim 19 comprising forming first and second doped regions adjacent to the first and second transistors that form source/drain (S/D) diffusion regions of the first and second transistors.

* * * * *